(12) United States Patent
Okuda et al.

(10) Patent No.: US 8,978,404 B2
(45) Date of Patent: Mar. 17, 2015

(54) AIR CONDITIONER

(75) Inventors: Noriyuki Okuda, Osaka (JP); Norihiro Takenaka, Osaka (JP); Tomohiro Masui, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 303 days.

(21) Appl. No.: 13/055,244

(22) PCT Filed: Jul. 15, 2009

(86) PCT No.: PCT/JP2009/003339
§ 371 (c)(1),
(2), (4) Date: Jan. 21, 2011

(87) PCT Pub. No.: WO2010/010673
PCT Pub. Date: Jan. 28, 2010

(65) Prior Publication Data
US 2011/0126568 A1 Jun. 2, 2011

(30) Foreign Application Priority Data
Jul. 24, 2008 (JP) .................... 2008-190850

(51) Int. Cl.
H05K 7/20 (2006.01)
F24F 1/24 (2011.01)
F25B 31/00 (2006.01)
F24F 13/20 (2006.01)

(52) U.S. Cl.
CPC ............... *H05K 7/2029* (2013.01); *F24F 1/24* (2013.01); *F24F 2013/207* (2013.01); *F25B 31/006* (2013.01)
USPC ...................................... 62/259.2

(58) Field of Classification Search
USPC .......... 62/259.2, 513, 331; 165/80.2; 361/707
See application file for complete search history.

(56) References Cited

U.S. PATENT DOCUMENTS

| | | | |
|---|---|---|---|
| 6,122,926 A * | 9/2000 | Kang et al. .................... | 62/259.2 |
| 6,233,959 B1 * | 5/2001 | Kang et al. .................... | 62/259.2 |
| 6,233,960 B1 * | 5/2001 | Kang et al. .................... | 62/259.2 |
| 6,243,268 B1 * | 6/2001 | Kang et al. .................... | 361/715 |
| 6,384,331 B1 * | 5/2002 | Ku ................ | 174/548 |
| 6,526,768 B2 * | 3/2003 | Wall et al. ....................... | 62/184 |
| 7,414,846 B2 * | 8/2008 | Cheng .................... | 361/699 |
| 7,579,805 B2 * | 8/2009 | Saito et al. .................... | 318/800 |
| 2005/0011212 A1 * | 1/2005 | Bistekos ....................... | 62/259.2 |
| 2006/0005549 A1 * | 1/2006 | Ishinabe et al. .................. | 62/3.2 |
| 2007/0144182 A1 * | 6/2007 | Sauciuc et al. ................... | 62/3.2 |

(Continued)

FOREIGN PATENT DOCUMENTS

| | | |
|---|---|---|
| EP | 1 862 743 A1 | 12/2007 |
| JP | 62-69066 A | 3/1987 |
| JP | 2006-214635 A | 8/2006 |

(Continued)

*Primary Examiner* — Mohammad M Ali
*Assistant Examiner* — Raheena Rehman
(74) *Attorney, Agent, or Firm* — Birch, Stewart, Kolasch & Birch, LLP

(57) ABSTRACT

An air conditioner includes a printed circuit board (31) to which a power device (33) is attached; and a refrigerant jacket (20) which is connected to the power device (33), and through which refrigerant used for a refrigeration cycle flows. The printed circuit board (31) is accommodated in a switch box (40). The refrigerant jacket (20) is fixed to the switch box (40) through a heat transfer plate (50), and the refrigerant jacket (20) and the printed circuit board (31) are connected together by the switch box (40).

4 Claims, 3 Drawing Sheets

(56) References Cited

U.S. PATENT DOCUMENTS

2007/0215316 A1* 9/2007 Saito et al. .................. 165/41
2008/0158817 A1* 7/2008 Tsunoda et al. ............ 361/697

FOREIGN PATENT DOCUMENTS

| JP | 2008-121966 A | | 5/2008 |
| JP | 2008121966 A | * | 5/2008 |

* cited by examiner

AIR CONDITIONER

TECHNICAL FIELD

The present invention relates to an air conditioner in which refrigerant circulates to perform a vapor compression refrigeration cycle.

BACKGROUND ART

In an air conditioner in which refrigerant circulates to perform a vapor compression refrigeration cycle, electrical circuits such as inverter circuits are mounted in order to control an operating state of an electric motor of a compressor. A power device generating high-temperature heat has been generally used for such an inverter circuit, and a unit configured to cool the power device is provided in a conventional air conditioner so that the temperature of the power device does not exceed a temperature at which the power device is operable. An example of such a cooling unit includes, e.g., a unit configured to cool a power device by refrigerant used for a refrigeration cycle (see, e.g., Patent Document 1). In an air conditioner of Patent Document 1, a refrigerant path through which the refrigerant used for the refrigeration cycle flows is provided in a refrigerant jacket (heat sink in Patent Document 1). In addition, the power device (giant transistor in Patent Document 1) is fixed to the refrigerant jacket, and the refrigerant jacket is accommodated in an electric component box.

CITATION LIST

Patent Document

PATENT DOCUMENT 1: Japanese Patent Publication No. S62-69066

SUMMARY OF THE INVENTION

Technical Problem

Some air conditioners provide a power device arranged on a printed circuit board to form an electrical circuit, where the printed circuit board is fixed inside a switch box.

As described above, when providing the power device on the printed circuit board, if the refrigerant jacket is attached to the power device as in the conventional air conditioner, there is a possibility that, due to vibration transferred from a compressor which is a vibration source through refrigerant pipes during operation, an excessive load acts on lead wires of the power device to cause a loose connection, and to damage the power device.

The present invention has been made in view of the foregoing, and it is an objective of the present invention that, in an air conditioner in which a power device is cooled by refrigerant flowing through a refrigerant jacket, an excessive load does not act on lead wires of the power device.

Solution to the Problem

In order to achieve the foregoing objective, a first aspect of the invention is intended for an air conditioner including a printed circuit board (31) to which a power device (33) is attached; and a refrigerant jacket (20) which is connected to the power device (33), and through which refrigerant used for a refrigeration cycle flows. Refrigerant flowing through the refrigerant jacket (20) cools the power device (33); and the printed circuit board (31) and the refrigerant jacket (20) are connected together by a common support member (40).

Thus, the printed circuit board (31) and the refrigerant jacket (20) are connected by the support member (40). For example, when the refrigerant jacket (20) is excited by vibration transferred through the refrigerant pipe, the printed circuit board (31) and the refrigerant jacket (20) similarly move (vibrate).

A second aspect of the invention is intended for the air conditioner of the first aspect of the invention, in which the support member (40) is a switch box (40) in which the printed circuit board (31) is accommodated.

Thus, the switch box (40) serves as the support member. For example, when the refrigerant jacket (20) is excited by vibration transferred though the refrigerant pipe, the printed circuit board (31) and the refrigerant jacket (20) similarly move (vibrate).

A third aspect of the invention is intended for the air conditioner of the first aspect of the invention, in which the power device (33) is attached to the refrigerant jacket (20) through a heat transfer plate (50).

Thus, the heat transfer plate (50) ensures a predetermined thermal capacity.

A fourth aspect of the invention is intended for the air conditioner of the third aspect of the invention, in which the heat transfer plate (50) is attached to the support member (40).

Thus, the refrigerant jacket (20) is indirectly fixed to the support member (40) through the heat transfer plate (50), and therefore the printed circuit board (31) and the refrigerant jacket (20) are connected together by the support member (40).

Advantages of the Invention

According to the first or second aspect of the invention, when the refrigerant jacket (20) is excited, the printed circuit board (31) and the refrigerant jacket (20) similarly move (vibrate). Thus, an excessive load does not act on lead wires (33a) of the power device (33). Consequently, a damage of the power device (33) can be reduced or prevented.

According to the third aspect of the invention, the heat transfer plate (50) ensures the predetermined thermal capacity, and therefore heat of the power device (33) can be released, e.g., when a refrigerant flow rate is low.

According to the fourth aspect of the invention, the predetermined thermal capacity can be ensured in order to release heat of the power device (33) when the refrigerant flow rate is low, and the excessive load does not act on the lead wires (33a) of the power device (33).

DESCRIPTION OF EMBODIMENTS

Embodiments of the present invention will be described below with reference to the drawings. Note that the embodiments below will be set forth merely for purposes of preferred examples in nature, and are not intended to limit the scope, applications, and use of the invention.

Figure 1:
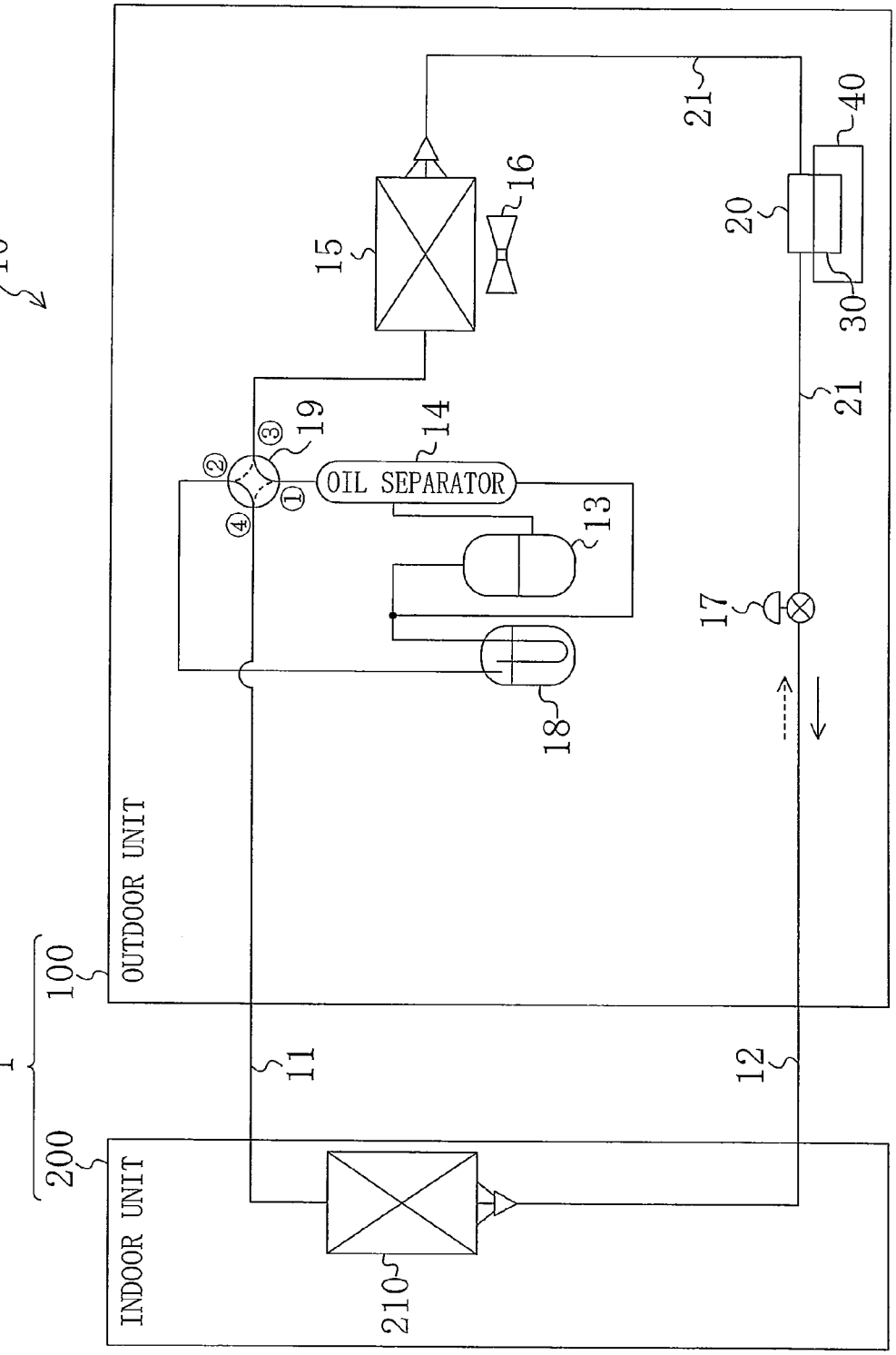
FIG. 1 is a piping system diagram of a refrigerant circuit in an air conditioner of an embodiment of the present invention.

FIG. 1 is a piping system diagram of a refrigerant circuit (10) in an air conditioner (1) of an embodiment of the present invention. The air conditioner (1) is an air conditioner for a vapor compression refrigeration cycle in which cooling and heating operations can be performed. As illustrated in FIG. 1, the air conditioner (1) includes an outdoor unit (100) arranged outside a room; and an indoor unit (200) arranged inside the room. The outdoor unit (100) and the indoor unit (200) are connected together through a first connecting pipe (11) and a second connecting pipe (12), and forms the refrigerant circuit (10) in which refrigerant circulates to perform the vapor compression refrigeration cycle.

<Indoor Unit>

The indoor unit (200) includes an indoor heat exchanger (210) for exchanging heat between refrigerant and outdoor air. As the indoor heat exchanger (210), e.g., a cross-fin type fin-and-tube heat exchanger can be employed. An indoor fan (not shown in the figure) is arranged near the indoor heat exchanger (210).

<Outdoor Unit>

The outdoor unit (100) includes a compressor (13), an oil separator (14), an outdoor heat exchanger (15), an outdoor fan (16), an expansion valve (17), an accumulator (18), a four-way valve (19), a refrigerant jacket (20), and an electrical circuit (30); and is accommodated in a case (outdoor unit casing (70) which will be described later).

The compressor (13) sucks refrigerant through a suction port, and compresses such refrigerant. Then, the compressor (13) discharges the compressed refrigerant through a discharge port. As the compressor (13), various compressors such as a scroll compressor can be employed.

The oil separator (14) separates the refrigerant discharged from the compressor (13) and containing lubrication oil into refrigerant and lubrication oil. Then, the oil separator (14) sends the refrigerant to the four-way valve (19), and returns the lubrication oil to the compressor (13).

The outdoor heat exchanger (15) is an air heat exchanger for exchanging heat between refrigerant and outdoor air, and, e.g., a cross-fin type fin-and-tube heat exchanger can be employed. The outdoor fan (16) for sending outdoor air to the outdoor heat exchanger (15) is arranged near the outdoor heat exchanger (15).

The expansion valve (17) is connected to the outdoor heat exchanger (15) and the indoor heat exchanger (210). The expansion valve (17) expands refrigerant flowing thereto, and then discharges the refrigerant, the pressure of which is reduced to a predetermined pressure. The expansion valve (17) may be, e.g., an electric expansion valve with variable opening.

The accumulator (18) separates refrigerant flowing thereto into gas and liquid, and sends the separated gaseous refrigerant to the compressor (13).

The four-way valve (19) includes first to fourth ports. The four-way valve (19) is switchable between a first position in which the first port communicates with the third port, and the second port communicates with the fourth port (position indicated by a solid line in FIG. 1); and a second position in which the first port communicates with the fourth port, and the second port communicates with the third port (position indicated by a dashed line in FIG. 1). In the outdoor unit (100), the first port is connected to the discharge port of the compressor (13) through the oil separator (14), and the second port is connected to the suction port of the compressor (13) through the accumulator (18). In addition, the third port is connected to the second connecting pipe (12) through the outdoor heat exchanger (15) and the expansion valve (17), and the fourth port is connected to the first connecting pipe (11). The four-way valve (19) is switched to the first position when performing the cooling operation in the outdoor unit (100), and is switched to the second position when performing the heating operation.

Figure 2:
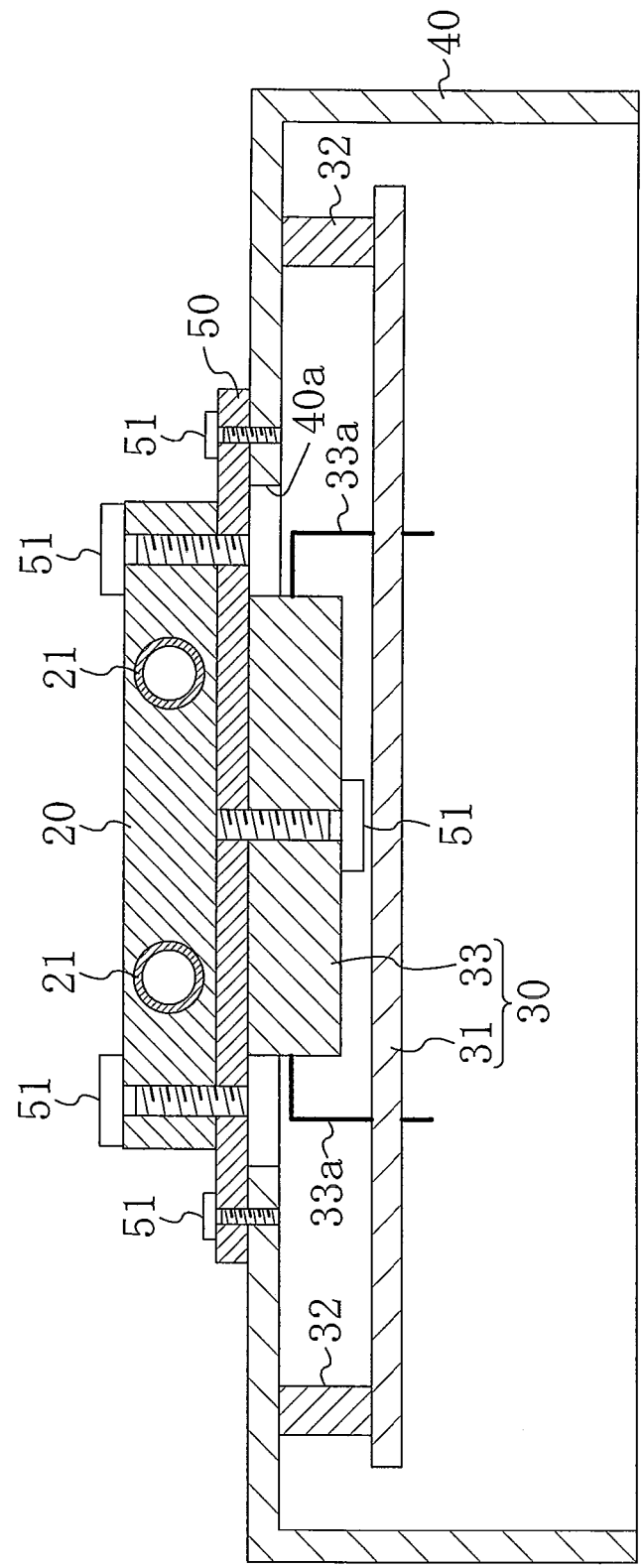
FIG. 2 is a view illustrating an attachment structure of a power device, a refrigerant jacket, and a heat transfer plate.

The refrigerant jacket (20) is formed of metal such as aluminum in flat rectangular parallelepiped shape. The refrigerant jacket (20) covers a part of a refrigerant pipe (21) connecting between the outdoor heat exchanger (15) and the expansion valve (17), and is thermally connected to the refrigerant pipe (21). Specifically, two through-holes into which the refrigerant pipe (21) is fitted are provided in the refrigerant jacket (20) as illustrated in FIG. 2. The refrigerant pipe (21) is bent in U-shape with the refrigerant pipe (21) passing through one of the through-holes, and then the bent refrigerant pipe (21) passes through the other through-hole. That is, the refrigerant jacket (20) is regarded as having refrigerant used in refrigeration cycle, circulating therein.

The electrical circuit (30) controls, e.g., a rotational speed of an electric motor of the compressor (13). The electrical circuit (30) is formed on a printed circuit board (31), and the printed circuit board (31) is fixed with spacers (32) inside a switch box (40). As illustrated in FIG. 2, a power device (33) with lead wires (33a) etc. are arranged above the printed circuit board (31) by, e.g., soldering the lead wires (33a). The power device (33) is, e.g., a switching device of an inverter circuit for supplying power to the electric motor of the compressor (13), and generates heat during an operation of the compressor (13). Thus, if the power device (33) is not cooled, there is a possibility that the temperature of the power device (33) exceeds a temperature at which the power device (33) is operable (e.g., 90° C.). For such a reason, the power device (33) is cooled by refrigerant flowing through the refrigerant jacket (20) in the air conditioner (1).

Specifically, in the air conditioner (1), the refrigerant jacket (20) is fixed to the switch box (40) to cool the power device (33) inside the switch box (40) as illustrated in FIG. 2. More specifically, the switch box (40) is formed in flat box shape with an opening at one end, and a through-hole (40a) is formed at an end facing the opening. A heat transfer plate (50) formed in plate-like shape is fixed with attachment screws (51) so as to cover the through-hole (40a). The heat transfer plate (50) is made of material which is relatively less resistant to heat, such as aluminum. The heat transfer plate (50) is provided for purposes of ensuring a predetermined thermal capacity, and dissipating heat of the power device (33) when a refrigerant flow rate is low. Thus, if the refrigerant jacket (20) has a sufficient thermal capacity, the heat transfer plate (50) is not necessarily provided.

The refrigerant jacket (20) is fixed to the heat transfer plate (50) with the attachment screws (51) from an outside of the switch box (40), and the power device (33) is fixed to the heat transfer plate (50) with the attachment screw (51) from an inside of the switch box (40). That is, the printed circuit board (31) and the refrigerant jacket (20) are connected together by the switch box (40) which is a common support member. In such a structure, heat of the power device (33) is transferred to the refrigerant jacket (20) through the heat transfer plate (50), and then is dissipated to refrigerant flowing through the refrigerant jacket (20).

Figure 3:
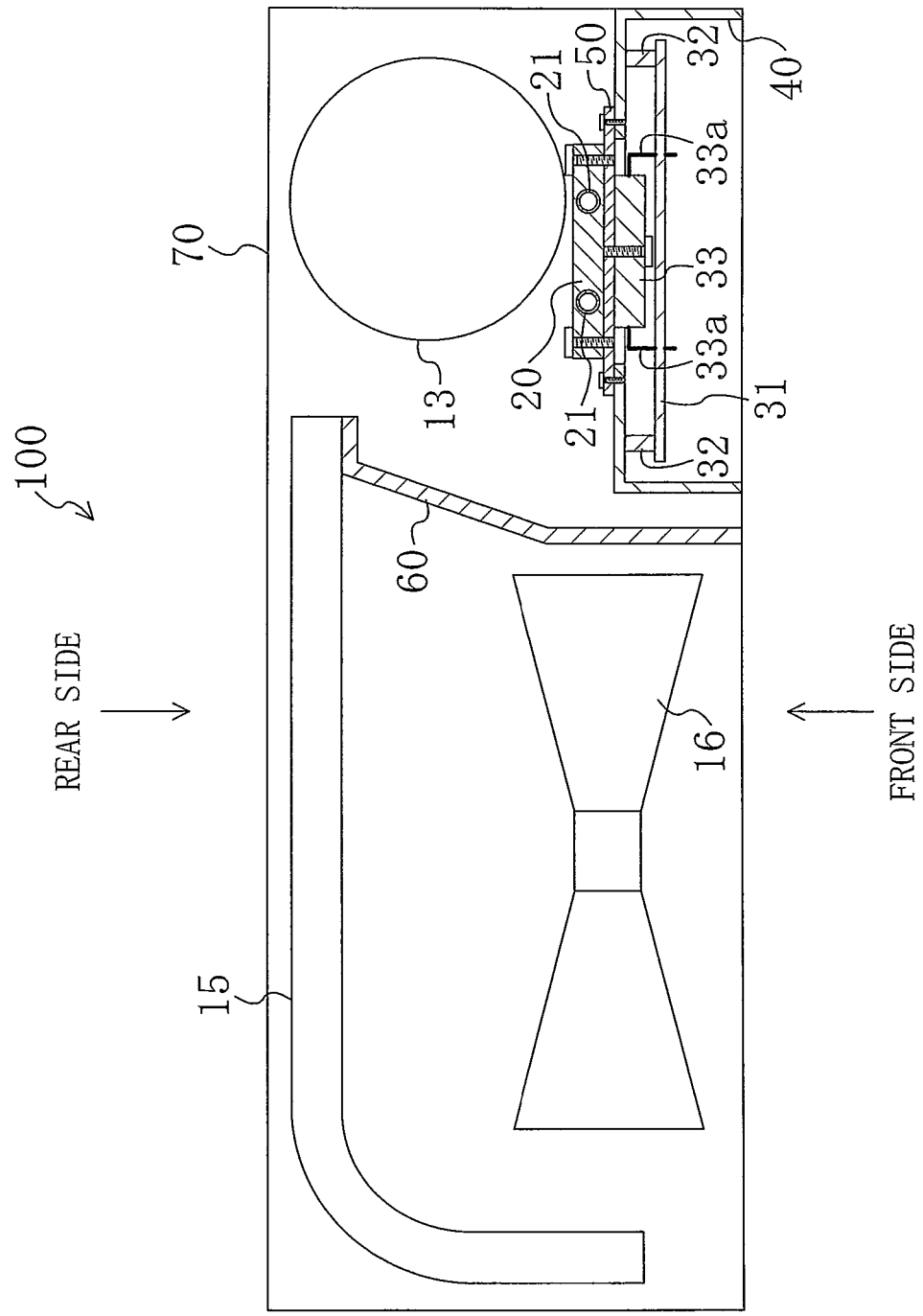
FIG. 3 is a view schematically illustrating a cross-sectional shape of an outdoor unit, and illustrates an arrangement of main components such as a compressor.

FIG. 3 is a view schematically illustrating a cross-sectional shape of the outdoor unit (100), and illustrates an arrangement of main components such as the compressor (13). As illustrated in FIG. 3, the outdoor unit casing (70) is divided into two compartments (a heat exchange chamber and a machine chamber) by a partitioning plate (60). In the heat exchanger chamber, the outdoor heat exchanger (15) having a cross section formed in L-shape is arranged so as to face side and rear surfaces of the outdoor unit casing (70), and the outdoor fan (16) is arranged near the outdoor heat exchanger (15). In the machine chamber, the refrigerant jacket (20), the compressor (13), the switch box (40), etc. are arranged. In this example, the opening of the switch box (40) faces a front side of the outdoor unit casing (70), and an attachment side of the heat transfer plate (50) (i.e., the refrigerant jacket (20) side) faces the compressor (13). This allows, e.g., an inspection of the electrical circuit (30) to be performed from the front side of the outdoor unit casing (70).

Operations of Air Conditioner (1)

Next, operations of the air conditioner (1) will be described. The air conditioner (1) switches the four-way valve (19) to the first or second position in order to perform the cooling or heating operation.

(Cooling Operation)

In the cooling operation, the four-way valve (19) is switched to the first position (position indicated by the solid line in FIG. 1). When the compressor (13) is in operation, refrigerant circulates through the refrigerant circuit (10) in a direction indicated by a solid arrow of FIG. 1.

Refrigerant discharged from the compressor (13) flows into the outdoor heat exchanger (15) through the oil separator (14) and the four-way valve (19), and then is condensed by dissipating heat to outdoor air taken by the outdoor fan (16), in the outdoor heat exchanger (15). After the condensed refrigerant passes through the refrigerant jacket (20), the refrigerant is expanded by the expansion valve (17), and then flows into the indoor unit (200) through the second connecting pipe (12).

In the indoor unit (200), the refrigerant is injected into the indoor heat exchanger (210), and then is evaporated by absorbing heat from indoor air in the indoor heat exchanger (210). Thus, the indoor air is cooled, resulting in the cooling of the room. Subsequently, the evaporated refrigerant is sucked into the compressor (13) through the four-way valve (19) and the accumulator (18), and then is compressed.

(Heating Operation)

On the other hand, in the heating operation, the four-way valve (19) is switched to the second position (position indicated by the dashed line in FIG. 1). When the compressor (13) is in operation, refrigerant circulates through the refrigerant circuit (10) in a direction indicated by a dashed arrow of FIG. 1.

Refrigerant discharged from the compressor (13) flows into the indoor unit (200) through the oil separator (14), the four-way valve (19), and the first connecting pipe (11). In the indoor unit (200), the refrigerant is injected into the indoor heat exchanger (210), and then is condensed by dissipating heat to indoor air in the indoor heat exchanger (210). Thus, the indoor air is heated, resulting in the heating of the room. Subsequently, the condensed refrigerant is injected into the outdoor unit (100) through the second connecting pipe (12).

In the outdoor unit (100), refrigerant is expanded by the expansion valve (17), and then flows into the outdoor heat exchanger (15) through the refrigerant jacket (20). In the outdoor heat exchanger (15), the refrigerant is evaporated by absorbing heat from outdoor air taken by the outdoor fan (16). The evaporated refrigerant is sucked into the compressor (13) through the four-way valve (19) and the accumulator (18), and then is compressed.

(Cooling of Power Device (33))

As described above, in the refrigerant jacket (20), refrigerant is condensed in the outdoor heat exchanger (15) in the cooling operation, and the refrigerant having a temperature lower than the temperature of the power device (33) flows. In the heating operation, refrigerant is condensed in the indoor heat exchanger (210), and the refrigerant having a temperature lower than the temperature of the power device (33) flows. In such cases, although the temperature of refrigerant flowing through the refrigerant jacket (20) is different depending on, e.g., operating conditions and outdoor air conditions, such refrigerant has, a temperature of, e.g., about 40-45° C. Thus, heat generated in the power device (33) of the electrical circuit (30) is transferred to the refrigerant jacket (20) through the heat transfer plate (50), and then the heat is dissipated to refrigerant of the refrigerant pipe (21) in the refrigerant jacket (20). This allows the power device (33) to be maintained at the temperature at which the power device (33) is operable.

(Load Acting on Lead Wires (33a) of Power Device (33))

In the cooling or heating operation, the compressor (13) generates vibration in response to an operation of the electric motor of the compressor (13). Such vibration, is transferred to the refrigerant jacket (20) through the refrigerant pipe (21). Thus, e.g., when vibrating the refrigerant jacket (20) with the printed circuit board (31) being fixed to the refrigerant jacket (20), an excessive load acts on the lead wires (33a) of the power device (33).

On the other hand, in the present embodiment, the refrigerant jacket (20) and the printed circuit board (31) are fixed to the switch box (40). Thus, as long as, e.g., the switch box (40) has sufficient stiffness, neither of the refrigerant jacket (20) nor the printed circuit board (31) vibrates even when vibration is transferred through the refrigerant pipe (21). As a result, the excessive load does not act on the lead wires (33a) of the power device (33) due to vibration.

Depending on the stiffness of the switch box (40), the refrigerant jacket (20) is exited and vibrated due to vibration transferred through the refrigerant pipe (21). However, the refrigerant jacket (20) and the printed circuit board (31) is connected together by the switch box (40), and therefore the refrigerant jacket (20) and the printed circuit board (31) similarly move (vibrate). Thus, in such a case, the excessive load does not act on the lead wires (33a) of the power device (33).

<<Other Embodiments>>

In addition to the configuration in which, as in the foregoing example, the refrigerant jacket (20) is indirectly fixed to the support member (switch box (40)) through the heat transfer plate (50), and the printed circuit board (31) is directly connected to the support member, a configuration may be employed, in which, e.g., the refrigerant jacket (20) is directly connected to a bracket (support member) having predetermined stiffness, and the printed circuit board (31) is indirectly fixed to the bracket through the switch box (40). That is, it is not necessary that the refrigerant jacket (20) and the printed circuit board (31) are directly connected to the support member, and the refrigerant jacket (20) and the printed circuit board (31) may be indirectly fixed to the support member. The bottom line is that, when vibration is transferred to the refrigerant jacket (20), the refrigerant jacket (20) and the printed circuit board (31) are fixed to the common support member so as to similarly move (vibrate).

INDUSTRIAL APPLICABILITY

The air conditioner of the present invention is useful as the air conditioner in which refrigerant circulates to perform the vapor compression refrigeration cycle.

DESCRIPTION OF REFERENCE CHARACTERS

1 Air Conditioner
20 Refrigerant Jacket

31 Printed Circuit Board
33 Power Device
40 Switch Box (Support Member)
50 Heat Transfer Plate

The invention claimed is:

1. An air conditioner, comprising:
a printed circuit board to which a power device including a lead wire is attached; and
a refrigerant jacket which is connected to the power device, the refrigerant jacket covering a portion of a refrigerant pipe through which refrigerant used for a refrigeration cycle flows,
wherein the refrigerant jacket is thermally connected to the covered portion of the refrigerant pipe such that heat transferred from the power device to the refrigerant jacket dissipates to the refrigerant flowing through the refrigerant pipe to cool the power device,
the printed circuit board and the refrigerant jacket are connected together by a common support member,
the power device is attached to the refrigerant jacket through a heat transfer plate, and
each of the heat transfer plate and the printed circuit board is separately attached to a plate-shaped part of the common support member.

2. The air conditioner of claim 1, wherein
the support member is a switch box in which the printed circuit board is accommodated.

3. The air conditioner of claim 1, wherein
the heat transfer plate is attached to one side surface of the plate-shaped part of the support member and the printed circuit board is attached to another side surface of the plate-shaped part of the support member, said side surfaces face in opposite directions.

4. The air conditioner of claim 2, wherein the switch box is formed in flat box shape with an opening at one end, and the plate-shaped part is formed at another end facing the opening.

* * * * *